(12) United States Patent
Lee et al.

(10) Patent No.: US 10,665,490 B2
(45) Date of Patent: May 26, 2020

(54) APPARATUS AND METHODS FOR EDGE RING REPLACEMENT, INSPECTION AND ALIGNMENT USING IMAGE SENSORS

(71) Applicant: Samsung Electronics Co., Ltd., Suwon-si, Gyeonggi-do (KR)

(72) Inventors: Ja-Woo Lee, Hwaseong-si (KR); Keon-Woo Kim, Seongnam-si (KR); Sun-Ho Kim, Seoul (KR); Eung-Su Kim, Seoul (KR); Bo-Ra Yoon, Goyang-si (KR); Hyan-Jung Lee, Hwaseong-si (KR); Tae-Il Cho, Daejeon (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/240,230

(22) Filed: Jan. 4, 2019

(65) Prior Publication Data

US 2020/0013657 A1 Jan. 9, 2020

(30) Foreign Application Priority Data

Jul. 4, 2018 (KR) .......................... 10-2018-0077863

(51) Int. Cl.
| | | |
|---|---|---|
| *H01L 21/68* | (2006.01) | |
| *H01J 37/32* | (2006.01) | |
| *H01L 21/67* | (2006.01) | |
| *H01L 21/687* | (2006.01) | |
| *H01L 21/683* | (2006.01) | |

(52) U.S. Cl.
CPC ........ *H01L 21/681* (2013.01); *H01J 37/3288* (2013.01); *H01J 37/32642* (2013.01); *H01L 21/67242* (2013.01); *H01L 21/67253* (2013.01); *H01L 21/67259* (2013.01); *H01L 21/67288* (2013.01); *H01L 21/6833* (2013.01); *H01L 21/68707* (2013.01); *H01L 21/68735* (2013.01); *H01L 21/68742* (2013.01)

(58) Field of Classification Search
CPC ............. G03F 7/70733; G03F 7/70741; G03F 7/7075; H01L 21/67242; H01L 21/67253; H01L 21/67259; H01L 21/67288; H01L 21/681; H01L 21/6833; H01L 21/68707; H01L 21/68735; H01L 21/68742
USPC .............................. 355/72, 77; 356/399, 400
See application file for complete search history.

(56) References Cited

U.S. PATENT DOCUMENTS

| | | |
|---|---|---|
| 8,314,371 B2 | 11/2012 | Sorabji et al. |
| 8,900,889 B2 | 12/2014 | Sorabji et al. |
| 9,390,950 B2 | 7/2016 | Sorabji et al. |

(Continued)

FOREIGN PATENT DOCUMENTS

| | | |
|---|---|---|
| KR | 10-2016-008820 | 7/2016 |
| KR | 10-2016-0088820 | 7/2016 |

(Continued)

*Primary Examiner* — Colin W Kreutzer
(74) *Attorney, Agent, or Firm* — Sughrue Mion, PLLC

(57) ABSTRACT

A first edge ring is removed from a substrate support within a process module using a transfer robot. The transfer robot is then used to place a second edge ring on the substrate support. An image sensor (e.g., a disk-shaped wireless image sensor) is positioned over the second edge ring using the transfer robot. The image sensor generates image information, which is analyzed to determine alignment of the second edge ring.

19 Claims, 12 Drawing Sheets

(56) References Cited

U.S. PATENT DOCUMENTS

| | | | |
|---|---|---|---|
| 9,564,349 B2 | 2/2017 | Sorabji et al. | |
| 9,831,110 B2 | 11/2017 | Francken et al. | |
| 9,966,290 B2 | 5/2018 | Senn | |
| 10,014,198 B2 | 7/2018 | Richardson | |
| 2003/0001083 A1* | 1/2003 | Corrado | G01D 11/245 250/239 |
| 2005/0266649 A1* | 12/2005 | Niwayama | H01L 21/67098 438/303 |
| 2006/0137988 A1* | 6/2006 | Yahashi | H01J 37/32642 205/82 |
| 2006/0151606 A1* | 7/2006 | Ramsey | H01L 21/67259 235/454 |
| 2012/0247671 A1* | 10/2012 | Sugawara | H01L 21/67346 156/345.31 |
| 2012/0287574 A1* | 11/2012 | Vishal | H01L 21/67248 361/688 |
| 2016/0211165 A1 | 7/2016 | McChesney et al. | |
| 2016/0211166 A1 | 7/2016 | Yan et al. | |
| 2017/0113355 A1 | 4/2017 | Genetti et al. | |
| 2017/0117170 A1* | 4/2017 | Wong | H01L 21/67167 |
| 2017/0263478 A1 | 9/2017 | McChesney et al. | |
| 2017/0287682 A1 | 10/2017 | Musselman et al. | |
| 2018/0053629 A1 | 2/2018 | Zhang et al. | |
| 2018/0090354 A1* | 3/2018 | Sugita | G01S 17/06 |
| 2018/0301322 A1* | 10/2018 | Sugita | H01L 21/67742 |

FOREIGN PATENT DOCUMENTS

| | | |
|---|---|---|
| KR | 10-2017-0015208 | 2/2017 |
| KR | 10-2017-0015209 | 2/2017 |
| KR | 10-2017-0022907 | 3/2017 |
| KR | 10-2018-0020876 | 6/2017 |
| KR | 10-2018-0021220 | 2/2018 |

* cited by examiner

APPARATUS AND METHODS FOR EDGE RING REPLACEMENT, INSPECTION AND ALIGNMENT USING IMAGE SENSORS

PRIORITY STATEMENT

This application claims priority under 35 U.S.C. § 119 to Korean Patent Application No. 10-2018-0077863, filed on Jul. 4, 2018 in the Korean Intellectual Property Office (KIPO), the contents of which are herein incorporated by reference in their entirety.

BACKGROUND

1. Field

Example embodiments relate to a substrate processing systems and methods. More particularly, example embodiments relate to apparatus and methods for edge ring replacement, inspection and alignment.

2. Description of the Related Art

In wafer processing systems, such as semiconductor etching equipment, an edge ring can be a consumable part that is damaged due to ion bombardment from plasma, thus requiring replacement of the damaged edge ring. However, in order to replace the damaged edge ring, the vacuum of a process chamber may need to be broken to allow replacement of the damaged part. Therefore, the process of replacing the damage edge ring may be time consuming and decrease productivity. Because a distance between an electrostatic chuck and the edge ring is an important factor influencing the yield of process, a precise alignment of the edge ring may be required.

SUMMARY

Example embodiments provide an edge ring replacement, inspection and alignment methods and apparatus for a substrate processing system which enables a precise replacement of an edge ring without breaking a process chamber vacuum which can thereby improve a process yield.

According to some example embodiments, methods include removing a first edge ring from a substrate support within a process module using a transfer robot. The transfer robot is then used to place a second edge ring on the substrate support. An image sensor (e.g., a disk-shaped wireless image sensor) is positioned over the second edge ring using the transfer robot. The image sensor generates image information, which is analyzed to determine alignment of the second edge ring.

According to further example embodiments, a substrate processing system includes a process module comprising a substrate support configured to support a substrate and a lift pin configured to movably extend from the substrate support to raise an edge ring on the substrate support. The system also includes a transfer module connected to the process module and comprising a transfer robot operative to selectively transfer disk-shaped substrates, edge rings and an image sensor to the substrate support. The system further includes a controller circuit configured to control the transfer robot and the lift pin responsive to image information generated by the image sensor.

According to still further example embodiments, an image sensor includes a housing configured to be placed on a substrate support of a substrate processing system and a plurality of cameras supported by the housing and configured to generate image information indicating positioning of an edge ring on the substrate support. The image sensor further includes a controller circuit supported by the housing and configured to control the plurality of cameras and a communications circuit operatively coupled to the controller circuit and configured to receive control signals for the controller circuit and transmit image information generated by the plurality of cameras.

According to some example embodiments, a consumable part in a substrate processing system, such as an edge ring within a process module, may be automatically replaced without a need to break a vacuum in the substrate processing system. Alignment of a newly replaced edge ring may be determined and corrected. Accordingly, time loss due to edge ring replacement and alignment may be reduced and edge ring alignment may be more precise. This can improve process yield.

BRIEF DESCRIPTION OF THE DRAWINGS

Example embodiments will be more clearly understood from the following detailed description taken in conjunction with the accompanying drawings. FIGS. 1 to 14 represent non-limiting, example embodiments as described herein.

FIG. 1 is a view illustrating substrate processing systems in accordance with example embodiments.

FIG. 2 is a perspective view illustrating a substrate support within a process module in FIG. 1.

FIG. 3 is an enlarged view illustrating 'A' portion in FIG. 2.

FIG. 4 is a cross-sectional view illustrating the substrate support in FIG. 2.

FIG. 5 is a block diagram illustrating a controller circuit connected to a lift mechanism and a second transfer robot of the substrate processing system in FIG. 1.

FIG. 7 is a plan view illustrating the disk-type image sensor which is moving over the substrate support in FIG. 1.

FIG. 8 is a block diagram illustrating a controller circuit in wireless communication with the disk-type image sensor in FIG. 7.

FIG. 9 is a graph illustrating a grayscale intensity of an image obtained by the disk-type image sensor in FIG. 7.

FIG. 10 is an exploded perspective view illustrating an image sensor for edge ring alignment inspection in accordance with example embodiments.

FIG. 11 is a perspective view illustrating components disposed on a lower surface of an upper plate of the image sensor in FIG. 10.

FIG. 12 is a perspective view illustrating components disposed on an upper surface of a frame of the image sensor in FIG. 10.

FIG. 13 is a bottom view illustrating the image sensor in FIG. 10.

FIG. 14 is a flow chart illustrating methods of operations for inspecting alignment of an edge ring in a substrate processing system in accordance with example embodiments.

DETAILED DESCRIPTION OF EXAMPLE EMBODIMENTS

Hereinafter, example embodiments will be explained in detail with reference to the accompanying drawings.

Figure 1:
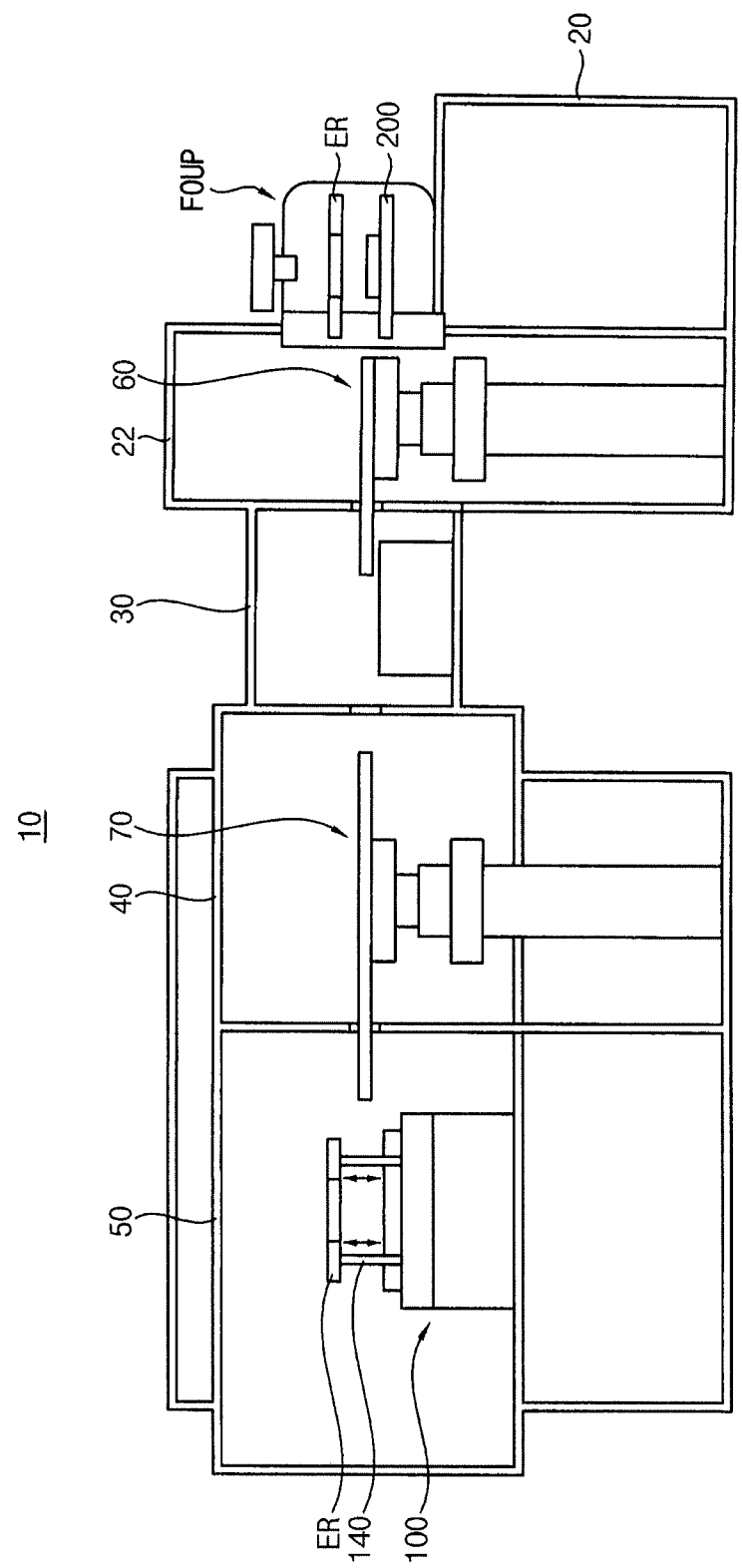
Figure 2:
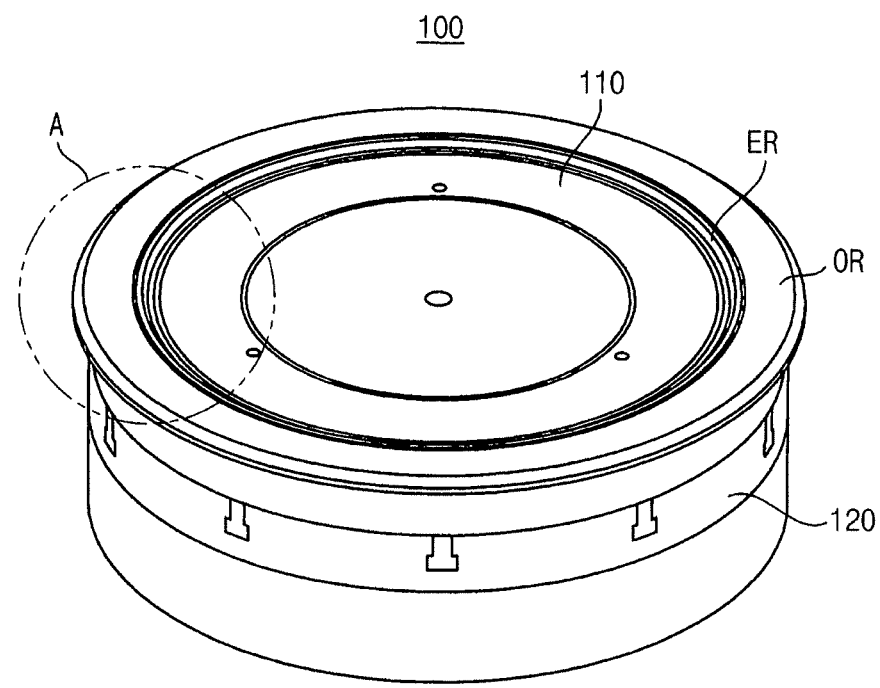
Figure 4:
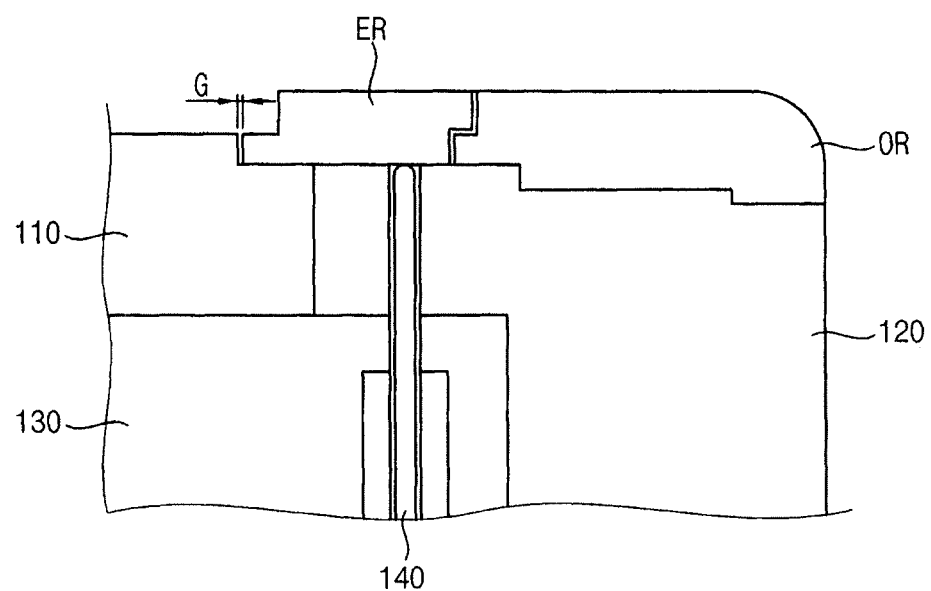
Figure 5:
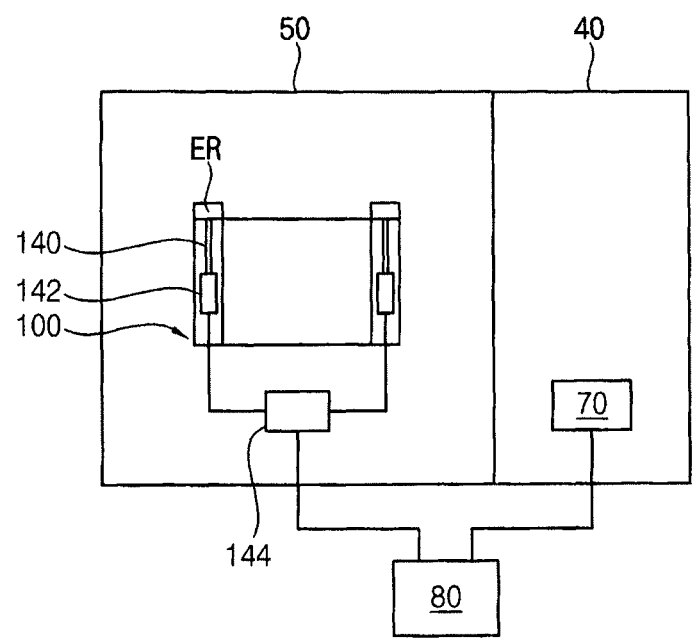
Figure 6A:
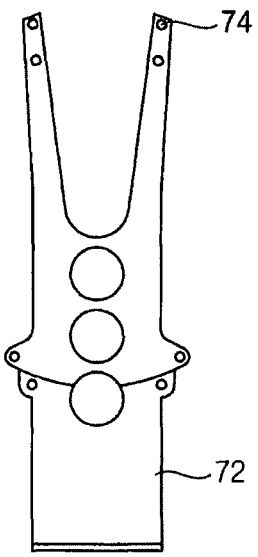
FIG. 6A is a plan view illustrating an end effector of the second transfer robot disposed within a vacuum transfer module in FIG. 1.
Figure 6B:
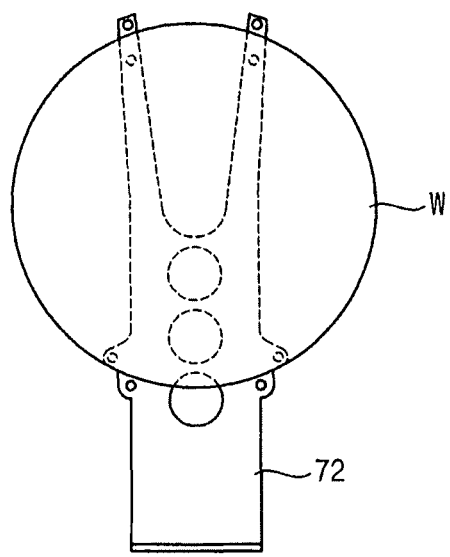
FIG. 6B is a plan view illustrating a wafer transferred by the end effector of FIG. 6A.
Figure 6C:
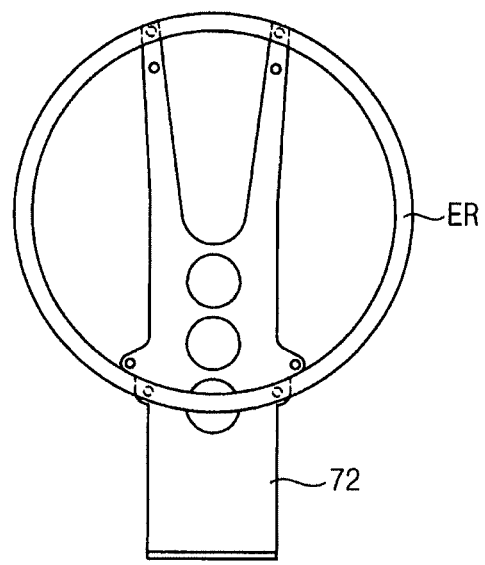
FIG. 6C is a plan view illustrating an edge ring transferred by the end effector of FIG. 6A.
Figure 6D:
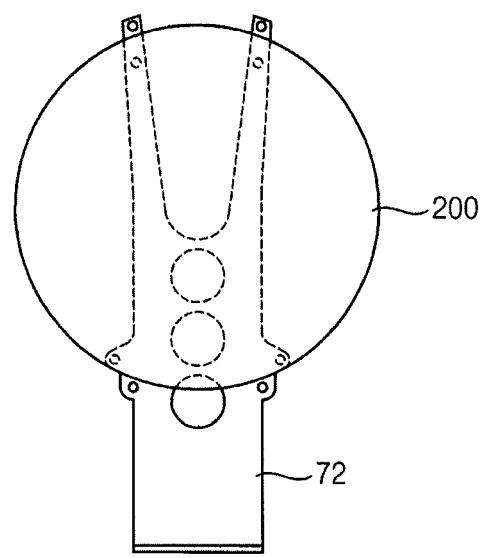
FIG. 6D is a plan view illustrating a disk-type image sensor transferred by the end effector of FIG. 6A.
Figure 7:
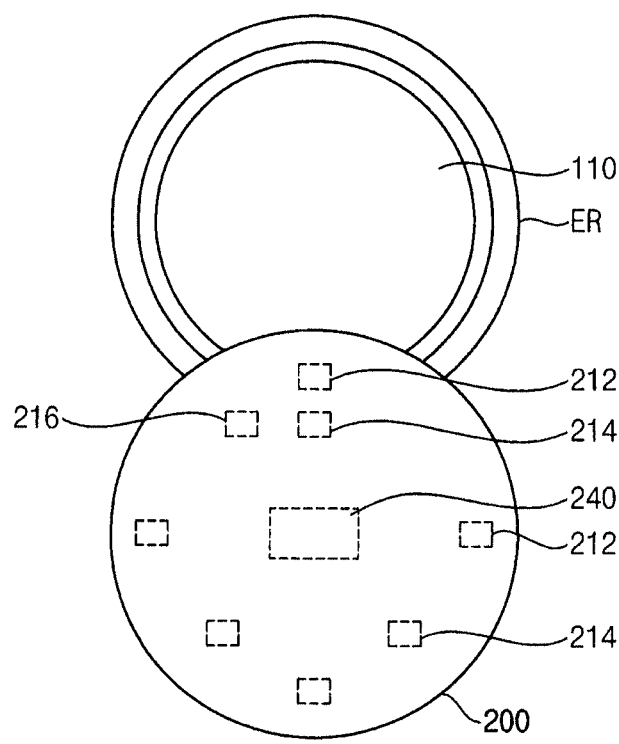
Figure 8:
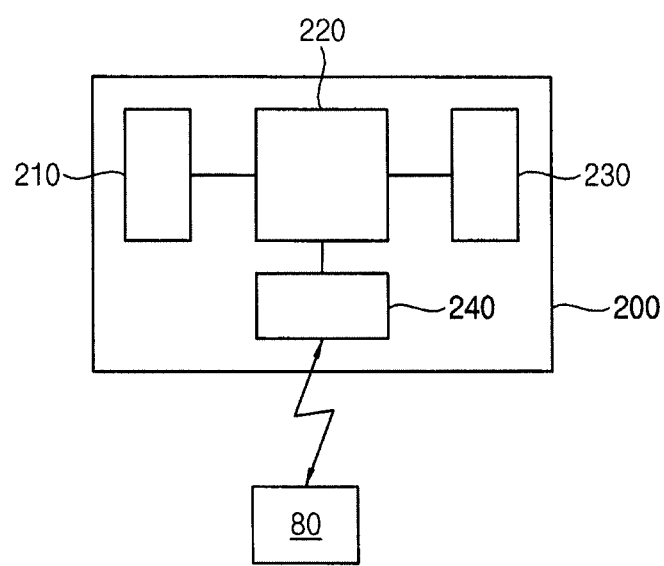
Figure 9:
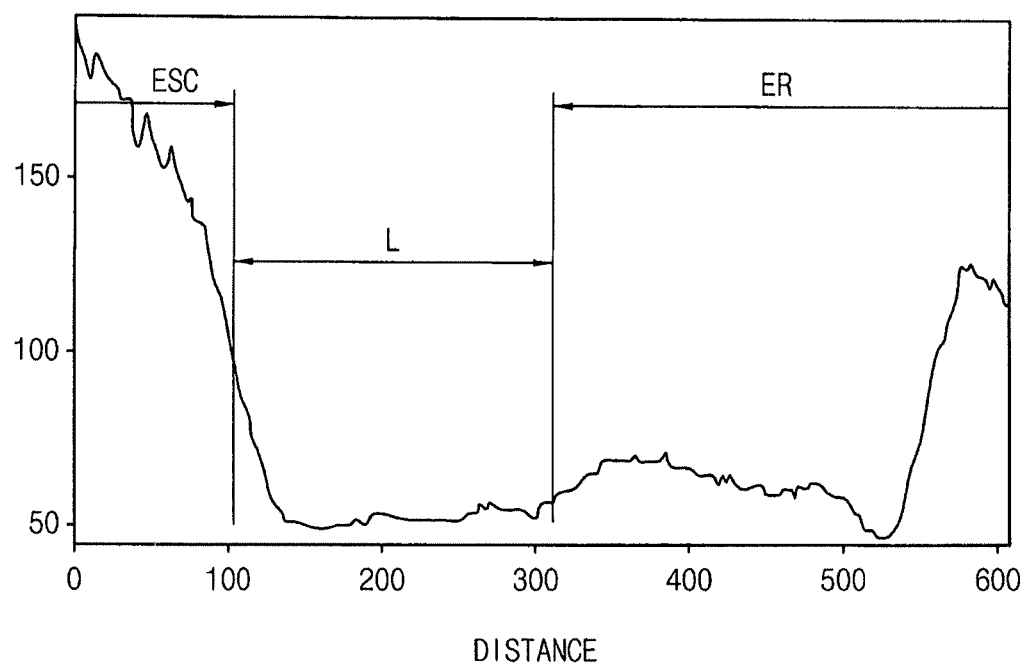

FIG. 1 is a view illustrating a substrate processing system in accordance with example embodiments. FIG. 2 is a perspective view illustrating a substrate support within a process module in FIG. 1. FIG. 2 is an enlarged view illustrating 'A' portion in FIG. 2. FIG. 4 is a cross-sectional view illustrating the substrate support in FIG. 2. FIG. 5 is a block diagram illustrating a controller circuit connected to a lift mechanism and a second transfer robot of the substrate processing system in FIG. 1. FIG. 6A is a plan view illustrating an end effector of the second transfer robot disposed within a vacuum transfer module in FIG. 1. FIG. 6B is a plan view illustrating a wafer transferred by the end effector of FIG. 6A. FIG. 6C is a plan view illustrating an edge ring transferred by the end effector of FIG. 6A. FIG. 6D is a plan view illustrating a disk-type image sensor transferred by the end effector of FIG. 6A. FIG. 7 is a plan view illustrating the disk-type image sensor which is moving over the substrate support in FIG. 1. FIG. 8 is a block diagram illustrating a controller circuit in wireless communication with the disk-type image sensor in FIG. 7. FIG. 9 is a graph illustrating a grayscale intensity of an image obtained by the disk-type image sensor in FIG. 7.

Referring to FIGS. 1 to 9, a substrate processing system 10 may include an index module, a vacuum transfer module 40 and at least one process module 50. Additionally, the substrate processing system 10 may further include a loadlock chamber 30 between the index module and the vacuum transfer module 40.

The index module may include a cassette stage 20 and an atmospheric transfer module 22. A carrier FOUP capable of receiving a plurality of wafers W, a plurality of edge rings ER or an image sensor 200 therein may be supported on a support plate of the cassette stage 20. A first transfer robot 60 within the atmospheric transfer module 22 may operate under ambient (i.e., atmospheric) condition, and may transfer the wafer, the edge ring or the image sensor between the carrier FOUP and the loadlock chamber 30.

The loadlock chamber 30 may serve as an interfacing chamber between the atmospheric transfer module 22 and the vacuum transfer module 40. Accordingly, the loadlock chamber 30 may provide a controlled interface to allow the transfer of the wafer, the edge ring or the image sensor from the atmospheric transfer module 22 to the vacuum transfer module 40.

A second transfer robot 70 within the vacuum transfer module 40 may operate under vacuum condition, and may transfer the wafer, the edge ring or the image sensor between the loadlock chamber 30 and the process module 50.

A plurality of the process modules 50 may be distributed uniformly around the vacuum transfer module 40. The process module 50 may be used to perform a semiconductor unit process (for example, etching process, deposition process, plating process, cleaning process, etc.). For example, the process module 50 may include a plasma processing apparatus capable of etching a substrate using plasma. The process module 50 may be an apparatus configured to etch a layer on the substrate such as a semiconductor wafer W within a chamber. Here, the substrate may include a semiconductor substrate, a glass substrate, etc. The process module 50 may include a chamber configured to provide a space for processing the substrate such as the wafer W and a substrate support 100 within the chamber to support the substrate.

The chamber may provide the space where a plasma etch process is performed on the wafer. The chamber may include a metal such as aluminum, stainless steel, etc.

Figure 3:
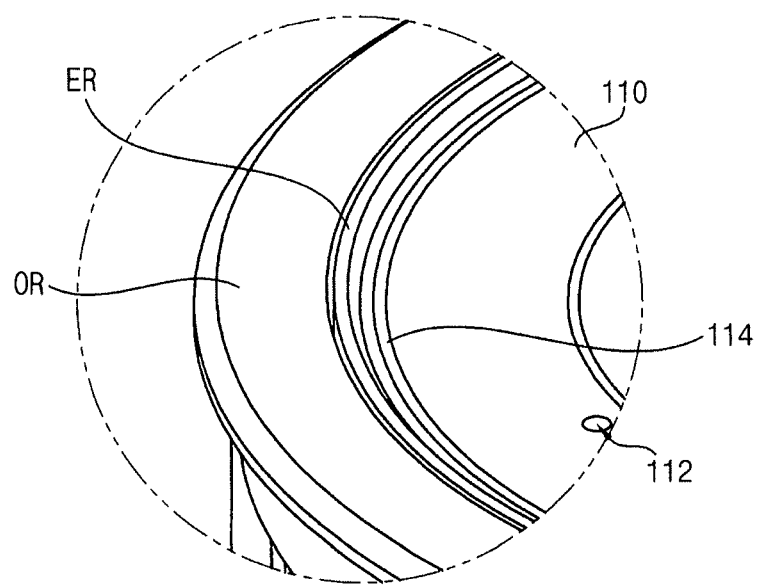

Referring to FIGS. 2 and 3, the substrate support 100 may include a support plate 110, an insulation ring 120, an insulation plate 130, an edge ring ER and an outer ring OR. The support plate 110 may be provided as an electrostatic chuck for holding the substrate using electrostatic force. The edge ring ER may be arranged on an upper surface of the substrate support 100 to surround the wafer. The edge ring ER may serve as a focus ring for precisely securing the wafer and focusing plasma onto the wafer. The outer ring OR may serve as a cover ring for protecting an outer surface of the edge ring ER.

In example embodiments, the substrate processing system 10 may further include a lift mechanism to enable the edge ring ER to be moved to a raised position. Referring to FIGS. 4 and 5, the lift mechanism may include a plurality of lift pins 140 to lift the edge ring ER to a raised position, actuators 142 to moving the lift pins 140 upward and downward, and an actuator drive 144 connected to the actuators 142 to provide the power to drive the actuator 142. The actuator drive 144 may be coupled to a controller circuit 80 to control operation of the lift mechanism during replacement of the edge ring ER.

The lift pin 140 may be movable upwardly and downwardly within the substrate support 100 to support the edge ring ER. The lift pin 140 may receive the edge ring ER transferred into the process module 50 by the end effector 72 of the second transfer robot 70 and may move the edge ring ER on the substrate support 100. The lift pin 140 may be retracted to seat the edge ring ER on the substrate support 100 or extended to lift the edge ring ER from the substrate support 100.

The substrate processing system 10 may further include an exhaust unit. The exhaust unit may be connected to an exhaust port which is installed in a bottom portion of the process module 50, through an exhaust line. The exhaust unit may include a vacuum pump such as a turbo-molecular pump or the like, to control a pressure of the process module 50 so that the processing space inside the process module 500 may be depressurized to a desired vacuum level. Additionally, process by-products and residual process gases may be discharged through the exhaust port.

In example embodiments, the controller circuit 80 may control various components connected to the controller circuit 80 in order to control the substrate process system 10. The controller circuit 80 may include some example components, such as a processor, memory and one or more interfaces. The controller circuit 80 may be employed to control devices connected to the controller circuit 80 based in part on sensed values.

For example, when the edge ring ER is to be replaced in the process module 50, the controller circuit 80 may control that the vacuum transfer module 40 and the process module 50 such that they are maintained at a vacuum state while the damaged edge ring ER may be replaced with a new edge ring ER. The process of replacing the damaged edge ring ER may be performed before the semiconductor wafer W is loaded into the process module 50. The controller circuit 80 may send control signals to the first and second transfer robots 60, 70 and the actuator drive 144 to retrieve the damaged edge ring ER and replace with a new edge ring ER on the substrate support 100.

Additionally, the controller circuit 80 may control an image sensor that photographs the newly replaced edge ring ER to inspect an arrangement state and may adjust the arrangement of the edge ring ER based on the inspection results. The controller circuit 80 may send control signals to the first and second transfer robots 60, 70 and the actuator drive 144 to move the disk-type image sensor 200 (see FIG. 1) over the edge ring ER and correct the position of the edge ring ER. When the disk-type image sensor 200 is inserted into the process module 50 to photograph the edge ring ER, the controller circuit 80 may control to maintain the vacuum transfer module 40 and the process module 50 while maintaining a vacuum state.

In example embodiments, the atmospheric transfer module 22 may include the first transfer robot 60 and the vacuum transfer module 40 may include the second transfer robot 70. The first transfer robot 60 may include a configuration the same as or similar to the second transfer robot 70. Hereinafter, the second transfer robot 70 will be explained, and any repetition explanation concerning the first transfer robot 60 will be omitted.

As illustrated in FIGS. 6A to 6D, the second transfer robot 70 may be configured to transfer the wafer W, the edge ring ER and the disk-type image sensor 200. The second transfer robot 70 may include an end effector 72 configured to move the wafer W, the edge ring ER and the disk-type image sensor 200. The end effector 72 may include a pair of fingers which extend to support the wafer W, the edge ring ER or the disk-type image sensor 200.

A plurality of contact pads 74 may be arranged on a surface of the end effector 72. For example, a first group of the contact pads may be used to make contact with the wafer W and the disk-type image sensor 200. A second group of the contact pads may be used to make contact with the edge ring ER.

As illustrated in FIG. 7, after a new edge ring ER has been mounted on the substrate support 100, the disk-type image sensor 200 may be provided to the process module 50 to photograph the alignment state of the edge ring ER. As illustrated in FIG. 7, the disk-type image sensor 200 may have a disk shape similar to a wafer. The disk-type image sensor 200 supported on the end effector 72 of the second transfer robot 70 may be slid into the process module 50 to be disposed over the substrate support 100.

Referring to FIGS. 7 and 8, the disk-type image sensor 200 may include a camera portion 210, a sensor controller circuit 220, a power source 230 and a communication circuit 240. The camera portion 210 may include first cameras 212 to photograph the edge ring ER, second cameras 214 to photograph wafer lift pin holes 112 of the support plate 110, and a third camera 216 to photograph wafer/edge ring lift pins of the substrate support 100 when the end effector 72 is slid into the process module 50.

Four first cameras 212 may be installed on a lower surface of the disk-type image sensor 200 along a circumferential region corresponding to the position of the edge ring ER to photograph the edge ring ER. Three second cameras 214 may be installed on the lower surface of the disk-type image sensor 200 corresponding to the wafer lift pin holes 112 of the support plate 110 to photograph the wafer lift pin holes 112. The third camera 216 may be installed in a front side of the disk-type image sensor 200 in the accessing direction of the end effector 72 to photograph the substrate support 100 when the disk-type image sensor 200 is moved over the substrate support 100.

The sensor controller circuit 220 may control operations of the camera portion 210. The sensor controller circuit 220 may generate a photograph control signal based on the control signal of the controller circuit 80. The camera portion 210 may be operated according to the photograph control signal.

The communication circuit 240 may communicate wirelessly with the controller circuit 80 for remote management of the disk-type image sensor 200. The communication circuit 240 may transmit the photographed image information to the controller circuit 80 in real time and may receive the control signal from the controller circuit 80. For example, the communication circuit 240 may include means of communications such as Wi-Fi, RF communications, etc., however, it may not be limited thereto.

The controller circuit 80 may analyze the alignment state of the edge ring ER based on the transmitted image information in real time, and may correct an alignment error of the edge ring ER based on the analysis.

For example, the controller circuit 80 may determine the alignment state of the disk-type image sensor 200 based on the transmitted image information from the second cameras 214. A reference position coordinate of the disk-type image sensor 200 may be determined using position vectors of the three wafer lift pins 112. The controller circuit 80 may determine the alignment state of the edge ring ER based on the transmitted image information from the first cameras 212. As illustrated in FIG. 9, a gap distance between the edge ring ER and the electrostatic chuck (ESC) 110 may be determined based on the image of the edge ring ER. Thus, whether or not the newly replaced edge ring ER is seated precisely on the substrate support 100 may be determined.

When it is determined that the edge ring ER is misaligned, the controller circuit 80 may transmit control signals for correcting misalignment of the edge ring ER, to the second transfer robot 70 and the actuator drive 144. In this case, the second transfer robot 70 may withdraw the disk-type image sensor 200 from the process module 50. Then, the lift mechanism may move the edge ring ER to the raised position and the end effector 72 of the second transfer robot 70 may be slid underneath the raised edge ring ER, and then, the lift pin 140 may be retracted to place the edge ring ER on the end effector 72. Then, the second transfer robot 70 may perform alignment correction of the edge ring ER, and then, the lift mechanism may raise the lift pin 140 to support the edge ring ER. The second transfer robot 70 may be withdrawn and then the disk-type image sensor 200 may be moved to the process module 50 to inspect the alignment state of the edge ring ER.

The controller circuit 80 may also determine whether or not the lift pin 140 operates normally based on the image information transmitted from the third camera 216 when the disk-type image sensor 200 is moved to the process module 50. In case that the lift pin 140 is raised by a malfunction when the disk-type image sensor 200 is moved to the process module 50, the controller circuit 80 may stop operation of the second transfer robot 70.

In some embodiments, the controller circuit 80 may determine the alignment state of the disk-type image sensor 200 based on the transmitted image information from the first cameras 212 instead of the second cameras 214. In this case, the second cameras may be omitted. The controller circuit 80 may detect an outer shape of the support plate (e.g., ESC) 110 photographed by the first cameras 212 to calculate a center coordinate of the support plate 110, and accordingly, may determine a reference position coordinate of the disk-type image sensor 200.

Alternatively, the controller circuit 80 may determine the alignment state of the disk-type image sensor 200 based on the transmitted image information from the first cameras 212 instead of the second cameras 214. The controller circuit 80 may calculate the center coordinate of the support plate 110 from an image of an outer dam 114 of the support plate 110 photographed by the first cameras 212, and accordingly, may determine the reference position coordinate of the disk-type image sensor 200.

Hereinafter, a configuration of the disk-type vision camera will be explained.

Figure 10:
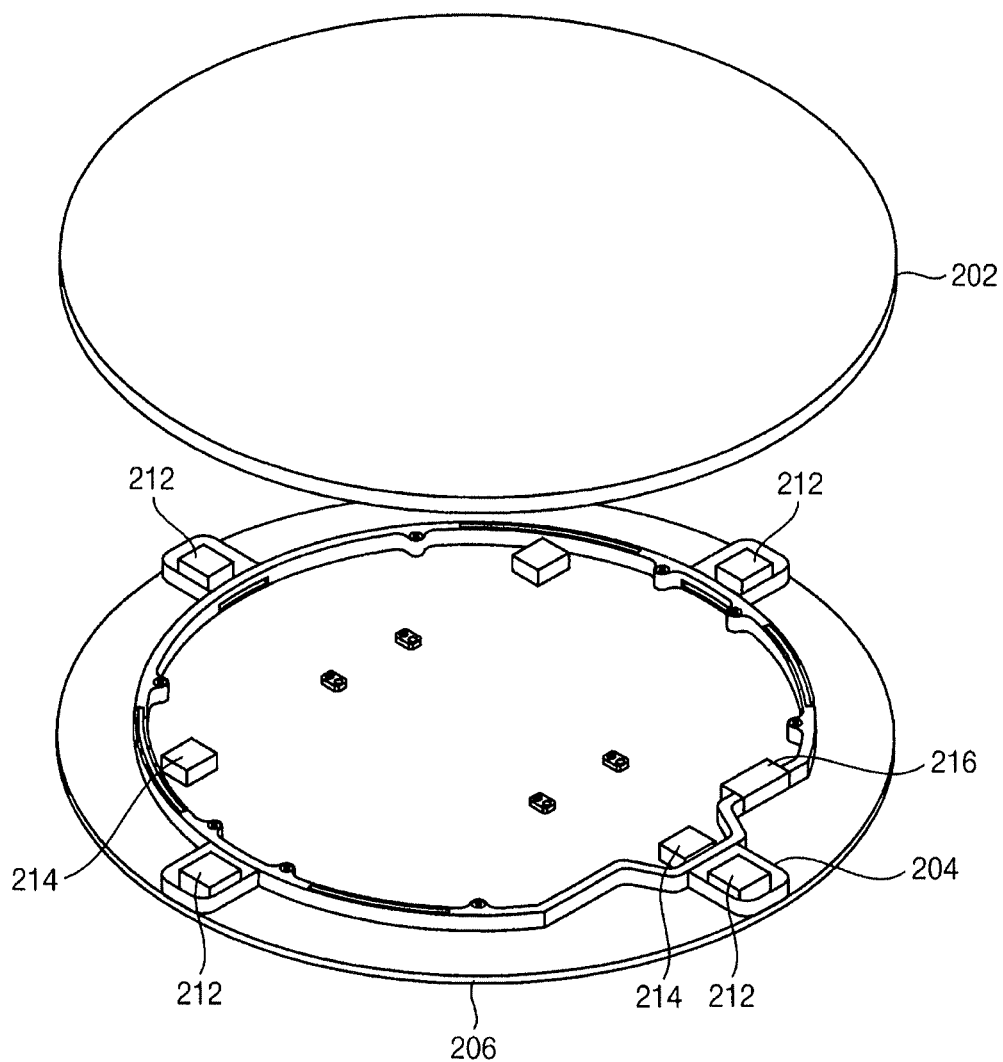
Figure 11:
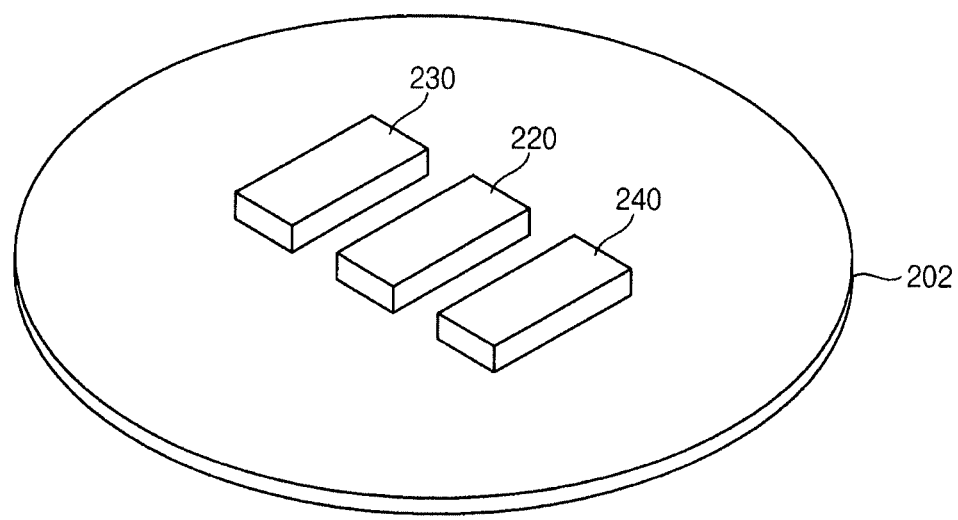
Figure 12:
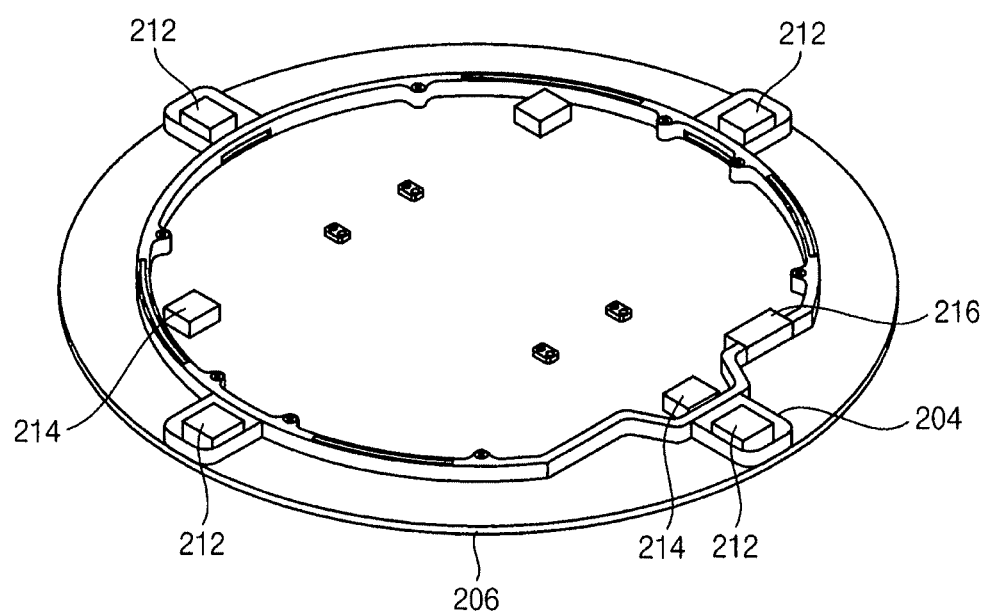
Figure 13:
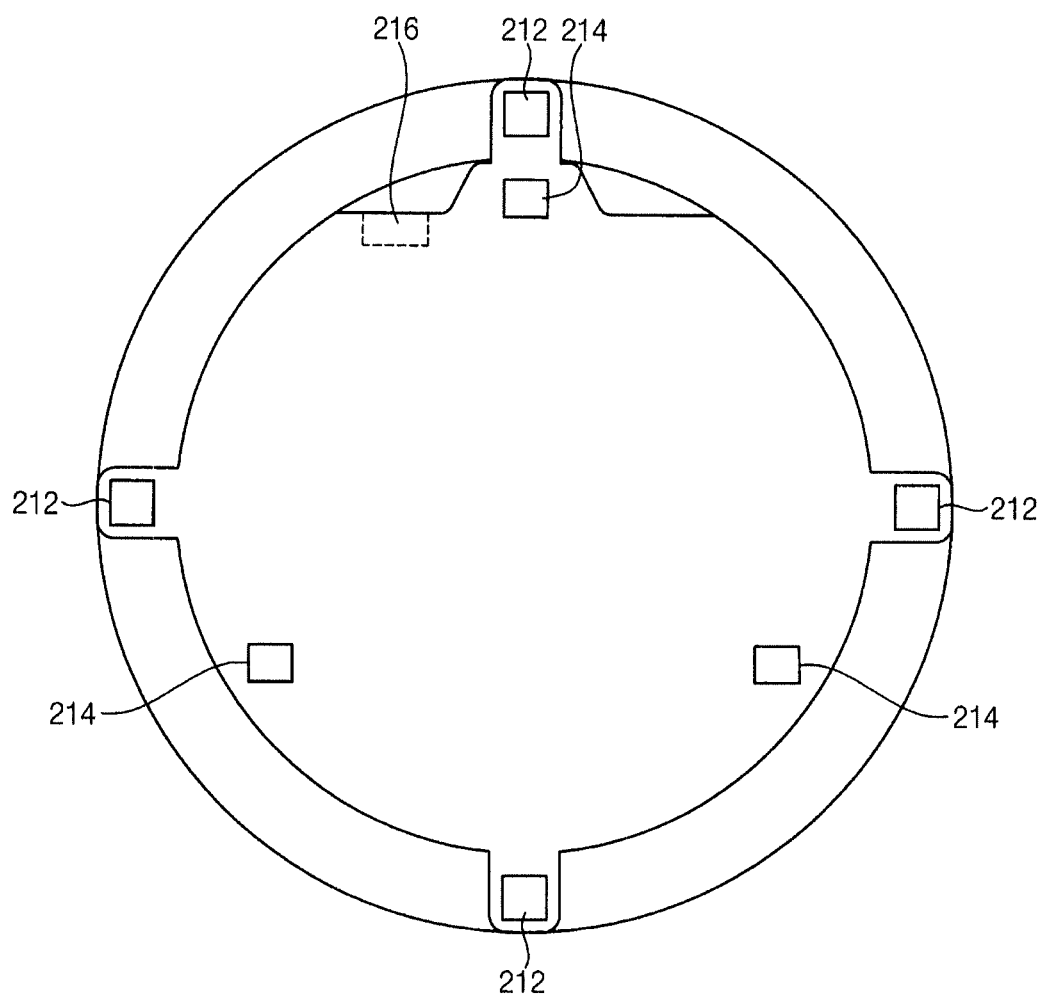

FIG. 10 is an exploded perspective view illustrating an image sensor for edge ring alignment inspection in accordance with example embodiments. FIG. 11 is a perspective view illustrating components disposed on a lower surface of an upper plate of the image sensor in FIG. 10. FIG. 12 is a perspective view illustrating components disposed on an upper surface of a frame of the image sensor in FIG. 10. FIG. 13 is a bottom view illustrating the image sensor in FIG. 10.

Referring to FIGS. 10 to 13, a disk-type image sensor 200 may include a housing having a disk shape. The disk-type housing may include a frame 204, an upper plate 202 on an upper surface of the frame 204 and a lower plate 206 disposed on a lower surface of the frame 204.

In example embodiments, the upper plate 202 and the frame 204 may be attached to each other. The lower plate 206 may have a shape corresponding to the upper plate 202, and may be attached to the lower surface of the frame 204. The upper plate 202 and the lower plate 206 may overlap each other with the frame 204 interposed therebetween. The disk-type image sensor 200 may have an overall disk shape corresponding to a wafer.

A camera portion having a plurality of cameras may be arranged on an upper surface of the frame 204. The camera portion may include first cameras 212, second cameras 214 and a third camera 216. The first to third cameras may include an illumination light source respectively.

Four first cameras 212 may be arranged along a relatively outermost circumferential region. The first cameras 212 may photograph through the lower surface of the frame 204. The second cameras 214 may be arranged in a relatively inner region of the image sensor in comparison to the first cameras 212. The second cameras 214 may photograph through the lower surface of the frame 204. The third camera 216 may be arranged in an outer side of the frame 204. The third camera 216 may be installed to photograph through a front side of the frame 204.

The lower plate 206 may be adhered to the lower surface of the frame 204. The lower plate 206 may include a transparent material. Accordingly, the first and second cameras 212, 214 may photograph through the lower surface of the frame 204.

The lower plate 206 may be spaced apart from the upper plate 202. The third camera 216 may photograph through a space between the upper plate 202 and the lower plate 206.

A sensor controller circuit 220, a power source 230 and a communication circuit 240 may be installed on the lower surface of the upper plate 202. Accordingly, the camera portion, the sensor controller circuit 220, the power source 230 and the communication circuit 240 may be disposed between the upper plate 202 and the lower plate 206.

As described with reference to FIGS. 7 and 8, the disk-type image sensor 200 may be supported on the end effector 72 of the second transfer robot 70 and may be moved by the end effector 72. In particular, the disk-type image sensor 200 supported on the end effector 72 may be moved into the process module 50 to be over the newly replaced edge ring ER. The first and second cameras 212, 214 of the disk-type image sensor 200 may photograph the edge ring ER through a space exposed between a pair of the fingers of the end effector 72.

Figure 14:
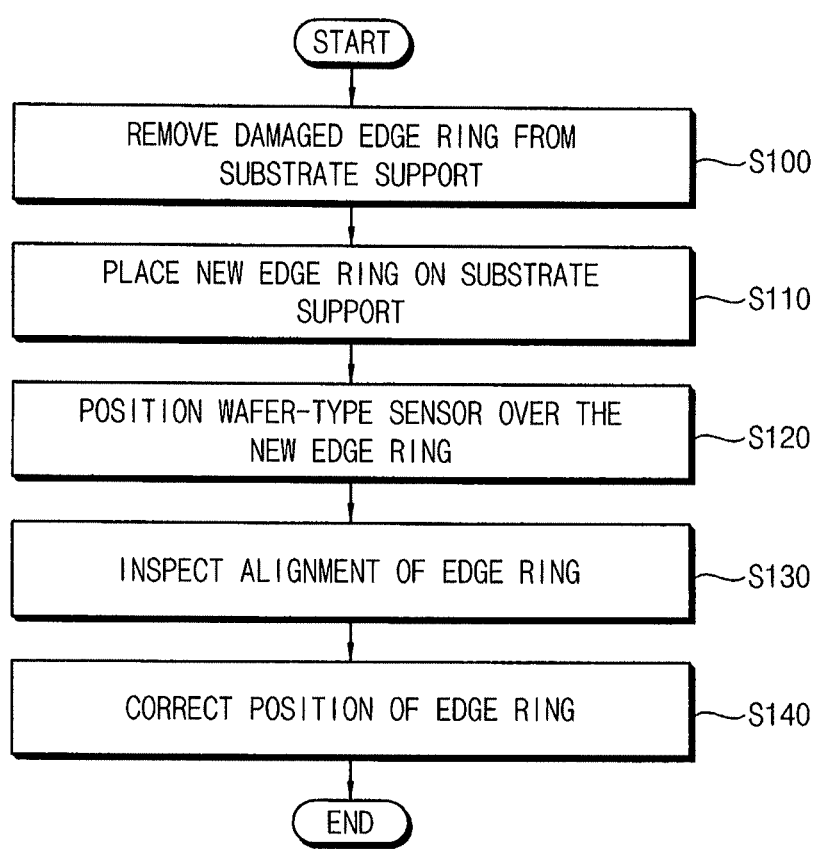

Hereinafter, operations for replacing an edge ring and a method of inspecting misalignment of the edge ring using the substrate processing system will be explained. FIG. 14 is a flow chart illustrating operations for inspecting alignment of an edge ring in a substrate processing system in accordance with example embodiments.

Referring to FIGS. 1, 5, 7, 8 and 14, a damaged edge ring ER within a process module 50 may be replaced by a new edge ring ER (S100, 110). In example embodiments, before a semiconductor wafer W is loaded into the process module 50 to perform a process on the wafer W, a carrier (FOUP) receiving a new edge ring ER and a disk-type image sensor 200 therein may be disposed on a cassette stage 20 and then a damaged edge ring ER may be withdrawn from the process module 50.

In particular, after a lift pin 140 is raised to move the damaged edge ring ER to a raised position, the end effector 72 of the second transfer robot 70 may be slid underneath the raised edge ring ER. The lift pin 140 may be retracted to place the edge ring ER on the end effector 72. Then, the second transfer robot 70 may transfer the edge ring ER from the process module 50 to a loadlock chamber 30. A first transfer robot 60 may transfer the edge ring ER from the loadlock chamber 30 to the carrier (FOUP).

The first transfer robot 60 may transfer the new edge ring ER from the carrier (FOUP) to the loadlock chamber 30, and the second transfer robot 70 may transfer the new edge ring ER from the loadlock chamber 30 to the process module 50.

In particular, the end effector 72 of the second transfer robot 70 supporting the new edge ring ER may be slid over a substrate support 100 within the process module 50. The lift pin 140 may be raised to support the new edge ring ER, the end effector 72 may be retracted, followed by retracting the lift pin 140 to place the new edge ring ER on the substrate support 100.

The disk-type image sensor 200 may be positioned over the newly replaced edge ring ER (S120), an alignment of the edge ring ER may be inspected (S130), and then, a position of the edge ring ER may be corrected based on the inspection results (S140). After the new edge ring ER is placed on the substrate support 100, the disk-type image sensor 200 may be moved into the process module 50 in order to photograph the edge ring ER. In particular, the first transfer robot 60 may transfer the disk-type image sensor 200 from the carrier (FOUP) to the loadlock chamber 30, and the second transfer robot 70 may transfer the disk-type image sensor 200 from the loadlock chamber 30 to the process module 50.

The end effector 72 of the second transfer robot 70 supporting the disk-type image sensor 200 may be slid over the substrate support 100 within the process module 50. While the disk-type image sensor 200 is supported over the substrate support 100 by the end effector 72, the disk-type image sensor 200 may photograph the newly replaced edge ring ER and transmit image information using wireless communications in real time.

For example, first cameras 212 of the disk-type image sensor 200 may photograph the edge ring ER, and second cameras 214 of the disk-type image sensor 200 may photograph wafer lift pin holes 112 of the substrate support 100.

A controller circuit 80 of a substrate processing system 10 may analyze the image information photographed by first to third cameras 212, 214, 216 in real time to inspect misalignment of the edge ring ER. The controller circuit 80 may calculate three position vectors of three wafer lift pins 112 to determine a reference position coordinate of the disk-type image sensor 200. The controller circuit 80 may determine a gap distance between the edge ring ER and an electrostatic chuck (ESC) 110 based on the image of the edge ring ER. Thus, whether or not the newly replaced edge ring ER is seated precisely on the substrate support 100 may be determined.

When it is determined that the edge ring ER is misaligned, the controller circuit 80 may transmit control signals to cause realignment of the edge ring ER, to the second transfer robot 70 and an actuator drive 144. In this case, the second transfer robot 70 may retract the disk-type image sensor 200 from the process module 50. Then, the lift mechanism may move the edge ring ER to the raised position and the end effector 72 of the second transfer robot 70 may be slid underneath the raised edge ring ER. The lift pin 140 may be retracted to place the edge ring ER on the end effector 72. The second transfer robot 70 may perform alignment correction of the edge ring ER, followed by the lift mechanism raising the lift pin 140 to support the edge ring ER. The second transfer robot 70 may be retracted and the disk-type image sensor 200 may be moved again to the process module 50 to inspect the alignment state of the edge ring ER.

In example embodiments, the third camera 216 of the disk-type image sensor 200 may photograph an upper portion of the substrate support 100. The controller circuit 80 may determine whether or not the lift pin 140 operates normally based on the image information transmitted from the third camera 216 when the disk-type image sensor 200 is moved to the process module 50. In case that the lift pin 140 operates abnormally when the disk-type image sensor 200 is moved to the process module 50, the controller circuit 80 may stop operation of the second transfer robot 70.

As mentioned above, a consumable part such as the edge ring ER, within the process module 50 may be replaced without a need to break vacuum in the substrate processing system 10, alignment of the newly replaced edge ring may be inspected, and then, misalignment of the edge ring ER may be corrected based on the inspection results. Accordingly, the edge ring ER may be automatically replaced without breaking vacuum to thereby prevent time loss due to manual tasking, and the edge ring may be aligned precisely to thereby improve the yield of process on an edge region of a wafer.

A semiconductor device manufactured by a substrate processing system in accordance with example embodiments may be used in various systems such as a computing system. The semiconductor device may include finFET, DRAM, VNAND, etc. The system may be applied to a computer, a portable computer, a laptop computer, a personal portable terminal, a tablet, a cell phone, a digital music player, etc.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present invention. Accordingly, all such modifications are intended to be included within the scope of example embodiments as defined in the claims.

What is claimed is:

1. A method comprising:
   removing a first edge ring from a substrate support within a process module using a transfer robot;
   placing a second edge ring on the substrate support using the transfer robot;
   positioning an image sensor over the second edge ring using the transfer robot; and
   generating image information using the image sensor; and
   analyzing the image information to determine alignment of the second edge ring,
   wherein generating the image information comprises photographing wafer lift pin holes of the substrate support using second cameras of the image sensor; and
   wherein analyzing the image information comprises determining a reference position coordinate of the image sensor based on images of the water lift pins holes.

2. The method of claim 1, wherein placing the second edge ring on the substrate support using the transfer robot comprises:
   supporting the second edge ring on an end effector of the transfer robot;
   positioning the end effector over the substrate support;
   extending a lift pin in the substrate support to lift the second edge ring;
   retracting the end effector from beneath the second edge ring; and
   retracting the lift pin to place the second edge ring on the substrate support.

3. The method of claim 2, wherein positioning the image sensor over the second edge ring using the transfer robot comprises:
   supporting the image sensor on the end effector, and
   positioning the end effector over the substrate support.

4. The method of claim 1, wherein analyzing the image information is preceded by transferring the image information from the image sensor using wireless communications.

5. The method of claim 1, wherein generating the image information further comprises photographing portions of the second edge ring adjacent to an electrostatic chuck of the substrate support using first cameras of the image sensor and wherein analyzing the image information further comprises determining a gap distance between the second edge ring and the electrostatic chuck based on images of the portions of the second edge ring.

6. The method of claim 5, wherein generating the image information further comprises photographing an upper portion of the substrate support using a third camera of the image sensor when the image sensor is positioned over the second edge ring and wherein analyzing the image information further comprises determining whether or not a lift pin of the substrate support operates normally.

7. The method of claim 5, wherein generating the image information further comprises photographing an outer shape of the electrostatic chuck of the substrate support using the first cameras of the image sensor and wherein analyzing the image information further comprises determining a reference position coordinate of the image sensor based on a center coordinate of the electrostatic chuck calculated from the image information.

8. The method of claim 1 further comprising correcting a misalignment of the second edge ring using the transfer robot responsive to the analyzed image information.

9. The method of claim 8, wherein correcting the misalignment of the second edge ring using the transfer robot comprises:
   extending a lift pin in the substrate support to raise the second edge ring;
   placing an end effector of the transfer robot underneath the raised second edge ring;

retracting the lift pin to place the second edge ring on the end effector;

moving the second edge ring using the end effector of the transfer robot;

extending the lift pin to raise the second edge ring that is moved above the end effector of the transfer robot;

moving the end effector of the transfer robot from beneath the second edge ring that is raised; and retracting the lift pin to place the second edge ring that is raised on the substrate support.

10. A substrate processing system, comprising:

a process module comprising a substrate support configured to support a substrate and a lift pin configured to movably extend from the substrate support to raise an edge ring on the substrate support;

a transfer module connected to the process module and comprising a transfer robot operative to transfer disk-shaped substrates, edge rings and an image sensor to the substrate support; and a controller circuit configured to control the transfer robot and the lift pin responsive to image information generated by the image sensor, wherein the image sensor comprises a plurality of first cameras configured to be aligned with the edge ring on the substrate support and a plurality of second cameras configured to be aligned with wafer pin holes on the substrate support.

11. The substrate processing system of claim 10, wherein the transfer robot comprises an end effector configured to carry the substrates, the edge rings and the image sensor.

12. The substrate processing system of claim 10, wherein the controller circuit is configured to operate the lift pin and the transfer robot to place an edge ring on the substrate and to align the placed edge ring on the substrate support using the image sensor.

13. The substrate processing system of claim 10, wherein the controller circuit is configured to operate the lift pin and the transfer robot to replace a first edge ring with a second edge ring and to align the second edge ring using the image sensor while the process module and the transfer module are maintained in a vacuum state.

14. The substrate processing system of claim 10, wherein the controller circuit is configured to operate the lift pin and the transfer robot to align an edge ring on the substrate support.

15. An image sensor comprising:

a housing configured to be placed on a substrate support of a substrate processing system;

a plurality of cameras supported by the housing and configured to generate image information indicating positioning of an edge ring on the substrate support;

a controller circuit supported by the housing and configured to control the plurality of cameras; and a communications circuit operatively coupled to the controller circuit and configured to receive control signals for the controller circuit and transmit image information generated by the plurality of cameras, wherein the plurality of cameras comprises a plurality of first cameras configured to be aligned with an edge ring on the substrate support and a plurality of second cameras configured to be aligned with wafer lift pin holes of the substrate support.

16. The disk-type vision sensor of claim 15, wherein the housing comprises:

a disk-shaped lower plate;

a frame on the lower plate; and a disk-shaped upper plate on the frame, wherein the plurality of cameras is supported by the frame between the upper and lower plates.

17. The disk-type vision sensor of claim 15, wherein the communication circuit is configured to wirelessly receive the control signals for the controller circuit and to wirelessly transmit the image information generated by the plurality of cameras.

18. The disk-type vision sensor of claim 15, wherein the plurality of first cameras are configured to photograph the edge ring on the substrate support and the plurality of second cameras configured to photograph the wafer lift pin holes of the substrate support.

19. The disk-type vision sensor of claim 15, wherein the plurality of cameras further comprises a third camera configured to photograph an upper portion of the substrate support.

* * * * *